(12) United States Patent
Horio et al.

(10) Patent No.: US 12,453,001 B2
(45) Date of Patent: Oct. 21, 2025

(54) CIRCUIT BOARD AND OPTICAL UNIT

(71) Applicant: Nidec Corporation, Kyoto (JP)

(72) Inventors: Naofumi Horio, Kyoto (JP); Shinri Ono, Kyoto (JP); Tomohiro Egawa, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 465 days.

(21) Appl. No.: 17/951,155

(22) Filed: Sep. 23, 2022

(65) Prior Publication Data
US 2023/0099047 A1   Mar. 30, 2023

(30) Foreign Application Priority Data
Sep. 30, 2021   (JP) .................................. 2021-162027

(51) Int. Cl.
| | | |
|---|---|---|
| H01R 12/00 | (2006.01) | |
| H01R 12/65 | (2011.01) | |
| H01R 12/78 | (2011.01) | |
| H04N 23/68 | (2023.01) | |
| H05K 1/02 | (2006.01) | |
| H05K 1/18 | (2006.01) | |

(52) U.S. Cl.
CPC ............. *H05K 1/028* (2013.01); *H01R 12/65* (2013.01); *H01R 12/78* (2013.01); *H04N 23/687* (2023.01); *H05K 1/181* (2013.01); *H01R 2201/18* (2013.01); *H05K 2201/058* (2013.01); *H05K 2201/10121* (2013.01); *H05K 2201/10189* (2013.01)

(58) Field of Classification Search
CPC ...... H04N 23/687; H01R 12/65; H01R 12/78; H05K 1/181
See application file for complete search history.

(56) References Cited

U.S. PATENT DOCUMENTS

| | | | | |
|---|---|---|---|---|
| 8,638,626 B2* | 1/2014 | Yang | ...................... | G11C 29/20 |
| | | | | 365/201 |
| 2007/0077805 A1* | 4/2007 | Nomura | ................. | H04N 23/68 |
| | | | | 348/E5.046 |
| 2009/0126976 A1* | 5/2009 | Iida | ........................ | H05K 1/028 |
| | | | | 29/829 |
| 2017/0353663 A1 | 12/2017 | Asakawa | | |

(Continued)

FOREIGN PATENT DOCUMENTS

| | | |
|---|---|---|
| CN | 111665677 A | 9/2020 |
| CN | 111683454 A | 9/2020 |
| CN | 212936006 U | 4/2021 |

(Continued)

*Primary Examiner* — Phuong Chi Thi Nguyen
(74) *Attorney, Agent, or Firm* — Keating & Bennett, LLP

(57) ABSTRACT

A circuit board includes a first wiring board, a second wiring board connected to the first wiring board, a third wiring board connected to the first wiring board, a connector, and an external terminal connector. A different-direction reference portion of the third wiring board extends in a direction different from an extending direction of a reference portion of the second wiring board between a first end of the third wiring board and a second end of the third wiring board. The connector electrically connects any portion between the reference portion and the second end of the second wiring board and any portion between the different-direction reference portion and the second end of the third wiring board.

20 Claims, 11 Drawing Sheets

(56) References Cited

U.S. PATENT DOCUMENTS

2021/0223661 A1 7/2021 Minamisawa et al.
2022/0091477 A1 3/2022 Minamisawa

FOREIGN PATENT DOCUMENTS

| JP | S6466991 A | 3/1989 |
| JP | 2007-093953 A | 4/2007 |
| JP | 2009-10259 A | 1/2009 |
| JP | 2017103152 A | 6/2017 |
| JP | 2017215550 A | 12/2017 |
| JP | 2020-086367 A | 6/2020 |

* cited by examiner

CIRCUIT BOARD AND OPTICAL UNIT

CROSS-REFERENCE TO RELATED APPLICATIONS

The present application claims priority under 35 U.S.C. § 119 to Japanese Patent Application No. 2021-162027, filed on Sep. 30, 2021, the entire contents of which are hereby incorporated herein by reference.

1. FIELD OF THE INVENTION

The present disclosure relates to a circuit board and an optical assembly.

2. BACKGROUND

An image blur sometimes occurs due to camera shake while capturing a still image or a moving image with a camera. An image stabilization device has been put into practical use to prevent such an image blur and enable clear imaging. When the camera shakes, the image stabilization device can remove image blur by correcting the position and orientation of a camera module according to the shake.

An imaging signal of the image stabilization device is output to the outside via a flexible printed circuit (FPC). Since the flexible printed circuit is movable according to the movement of an imaging element, when the resistance of the flexible printed circuit is large, the operation may be hindered. Therefore, it has been studied to appropriately adjust the resistance of the flexible printed circuit. In a conventional folded circuit board structure, since a movable carrier plate swings with respect to a fixed carrier plate about a plurality of axes, power consumption can be reduced. In the conventional folded circuit board structure, a pair of carrier plates extend from both sides of a folding carrier plate located at the center, and are connected with external terminals.

However, in the conventional folded circuit board structure, it is necessary to connect an external terminal for extracting a signal acquired by the imaging element to the outside to each of the pair of carrier plates.

SUMMARY

A circuit board according to an example embodiment of the present disclosure includes a first wiring board, a second wiring board connected to the first wiring board, a third wiring board connected to the first wiring board, a connector, and an external terminal connector. The second wiring board includes a first end, a second end, and a reference portion. The first end of the second wiring board is connected to the first wiring board. The reference portion of the second wiring board is located at any position between the first end of the second wiring board and the second end of the second wiring board. The third wiring board includes a first end, a second end, and a different-direction reference portion. The first end of the third wiring board is connected to the first wiring board. The different-direction reference portion of the third wiring board extends in a direction different from an extending direction of the reference portion in any position between the first end of the third wiring board and the second end of the third wiring board. The connector electrically connects any portion between the reference portion and the second end of the second wiring board and any portion between the different-direction reference portion and the second end of the third wiring board. The external terminal connector extends from one of the second wiring board and the third wiring board in a direction different from a direction in which the second wiring board and the third wiring board are connected by the connector, and is connected to an external terminal.

An optical assembly according to another example embodiment of the present disclosure includes a movable body including an optical element, a fixed body that swingably supports the movable body, a swing mechanism that swings the movable body with respect to the fixed body, and the circuit board described above connected to the movable body.

The above and other elements, features, steps, characteristics and advantages of the present disclosure will become more apparent from the following detailed description of the example embodiments with reference to the attached drawings.

DETAILED DESCRIPTION

Figure 1:
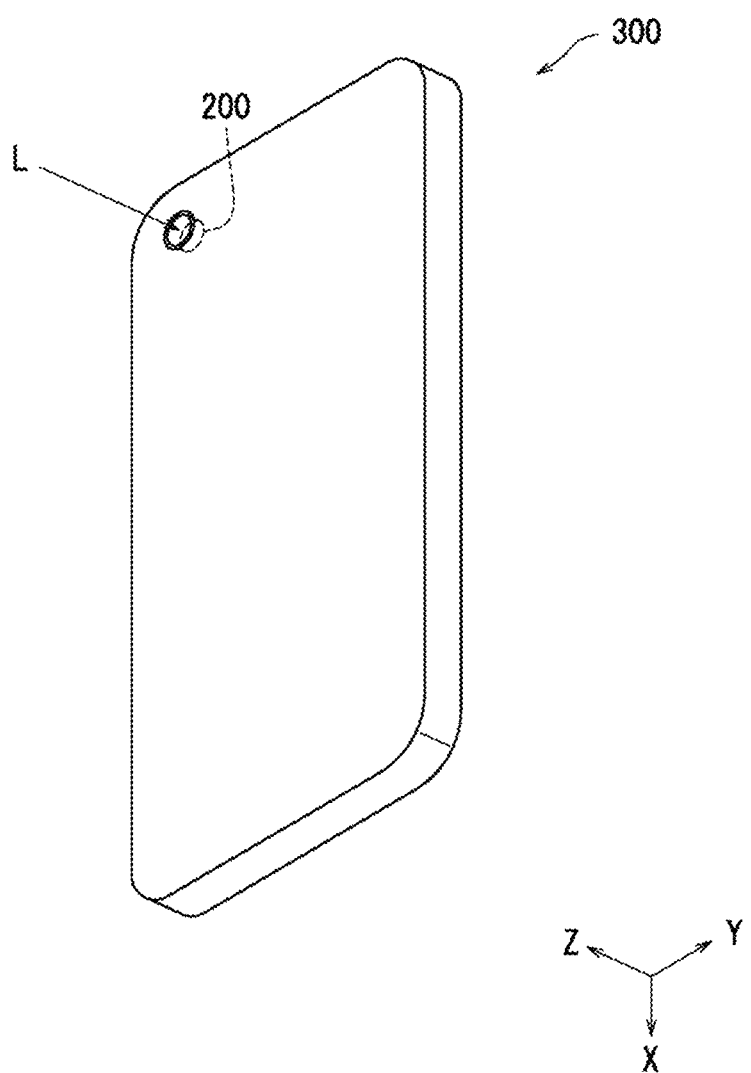
FIG. 1 is a schematic perspective view of a smartphone including an optical assembly of an example embodiment of the present disclosure.

Circuit boards and optical assemblies according to example embodiments of the present disclosure will be described below with reference to the drawings. Note that in the drawings, the same or corresponding parts will be denoted by the same reference symbols and description of such parts will not be repeated. Note that in the description of the present application, an X-axis, a Y-axis, and a Z-axis that are orthogonal to one another may be used to facilitate understanding of example embodiments of the present disclosure. Here, it should be noted that the X-axis, the Y-axis, and the Z-axis do not limit the orientation of the optical assemblies during use. In the description of the present application, the X-axis direction may be referred to as a first direction, the Y-axis direction may be referred to as a second direction, and the Z-axis direction may be referred to as a third direction. It should be noted that the relationships between the X-axis, Y-axis, and Z-axis directions and the first to third directions are not limited to the above.

Note that in the present specification, in a positional relationship between any one of orientations, lines, and surfaces and another one of them, the term "parallel" means not only a state where the two never cross each other no matter how long they extend, but also a state where the two are substantially parallel. The terms "perpendicular" and "orthogonal" include not only a state in which the two intersect each other at 90 degrees, but also a state in which the two are substantially perpendicular to each other and a state in which the two are substantially orthogonal to each other. That is, it goes without saying that the terms "parallel", "vertical", and "orthogonal" may each include a state in which there is an angular deviation to the extent that the effect of the present disclosure is exhibited in the positional relationship between the two.

An optical assembly of the present example embodiment is suitably used as an optical component of a smartphone.

First, a smartphone 300 including an optical assembly 200 of the present example embodiment will be described with reference to FIG. 1. FIG. 1 is a schematic perspective view of the smartphone 300 including the optical assembly 200 of the present example embodiment.

As illustrated in FIG. 1, the smartphone 300 of the present example embodiment includes the optical assembly 200. The optical assembly 200 is incorporated in the smartphone 300 as an example. Light L enters the smartphone 300 from the outside through the optical assembly 200, and a subject image is captured on the basis of the light that enters the optical assembly 200. The optical assembly 200 is used to correct blur of the captured image when the smartphone 300 shakes. Note that the optical assembly 200 may include an imaging element, and the optical assembly 200 may include an optical member that transmits light to the imaging element. Since the smartphone 300 includes the optical assembly 200, shake of the smartphone 300 can be corrected.

The optical assembly 200 is preferably manufactured in a small size. As a result, the smartphone 300 itself can be downsized, or another component can be incorporated in the smartphone 300 without upsizing the smartphone 300.

Note that the application of the optical assembly 200 is not limited to the smartphone 300, and the optical assembly 200 can be used in various devices such as cameras and videos without particular limitation. For example, the optical assembly 200 may be incorporated in, for example, an imaging device such as a mobile phone with a camera or a drive recorder, or an action camera and a wearable camera incorporated in a moving body such as a helmet, a bicycle, or a radio-controlled helicopter.

Figure 2:
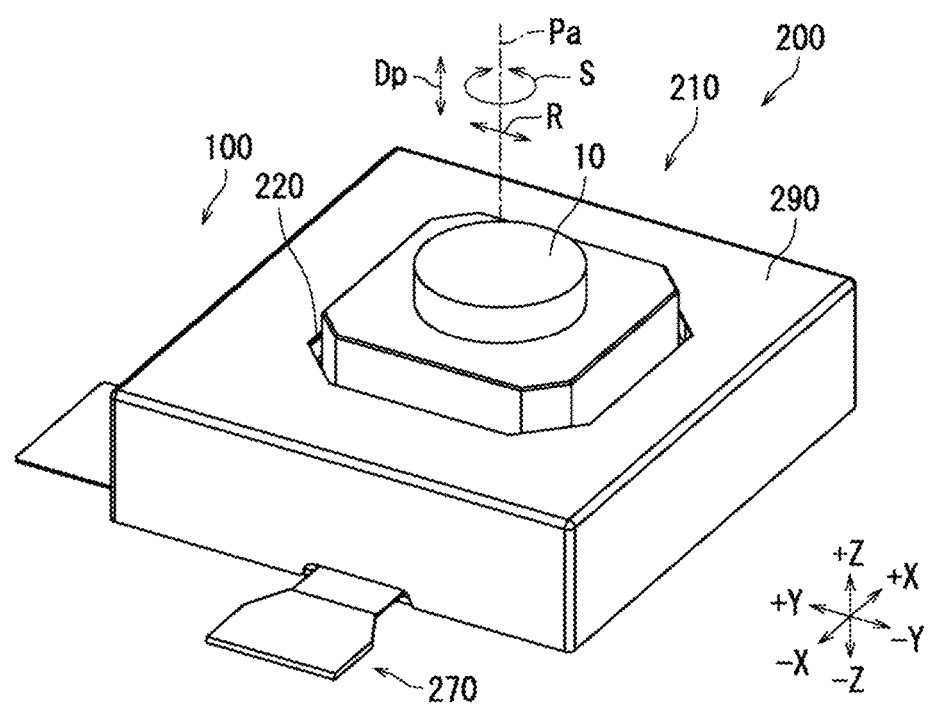
FIG. 2 is a schematic perspective view of an optical assembly of an example embodiment of the present disclosure.

Next, the optical assembly 200 according to the present example embodiment will be described with reference to FIGS. 1 and 2. FIG. 2 is a schematic perspective view of the optical assembly 200 of the present example embodiment.

As illustrated in FIG. 2, the optical assembly 200 includes a movable body 210, a fixed body 220, a circuit board 100, a circuit board 270, and a housing case 290. The movable body 210 includes an optical element 10 including at least an imaging element. The movable body 210 is arranged so as to be swingable with respect to the fixed body 220. Here, the fixed body 220 is covered with the housing case 290. The circuit board 100 and a part of the circuit board 270 extend from the inside to the outside of the fixed body 220 and the housing case 290. The circuit board 100 extends in the +Y direction from the fixed body 220 and the housing case 290. The circuit board 270 extends in the −X direction from the fixed body 220 and the housing case 290.

The optical element 10 has an optical axis Pa. The optical axis Pa extends in the Z direction from the center of a surface on the +Z direction side of the optical element 10. Light along the optical axis Pa enters the optical element 10. The light incident surface of the optical element 10 is arranged on a front surface on the +Z direction side of the optical element 10. The optical axis Pa extends in the normal direction with respect to the light incident surface. The optical axis Pa extends in an optical axis direction Dp. The optical axis direction Dp is parallel to the normal line of the light incident surface of the optical element 10.

A direction orthogonal to the optical axis direction Dp is a direction intersecting the optical axis Pa and perpendicular to the optical axis Pa. In the present specification, a direction orthogonal to the optical axis Pa may be referred to as a "radial direction". Of the radial directions, radially outward indicates a direction separating from the optical axis Pa. In FIG. 2, reference symbol R indicates an example of the radial direction. Further, a direction of rotation about the optical axis Pa may be referred to as a "circumferential direction". In FIG. 2, reference symbol S indicates the circumferential direction.

When the movable body 210 is inserted into the fixed body 220 and the movable body 210 is mounted on the fixed body 220, the optical axis Pa of the optical element 10 becomes parallel to the Z-axis direction. When the movable body 210 moves with respect to the fixed body 220 from this state, the optical axis Pa of the optical element 10 swings, and the optical axis Pa is no longer parallel to the Z-axis direction.

Hereinafter, it is assumed that the movable body 210 is not moved with respect to the fixed body 220 and the state in which the optical axis Pa is parallel to the Z-axis direction is maintained. That is, in the description of the shape, positional relationship, operation, and the like of the movable body 210, the fixed body 220, and the like with reference to the optical axis Pa, it is assumed that the optical axis Pa is parallel to the Z-axis direction unless inclination of the optical axis Pa is specifically described.

The movable body 210 is rotatable about at least a first rotation axis extending in the third direction (e.g., Z direction). The movable body 210 is housed in the fixed body 220. Note that when the movable body 210 is housed in the fixed body 220, the entire movable body 210 is not necessarily located inside the fixed body 220, and a part of the movable body 210 may be exposed or protrude from the fixed body 220.

The fixed body 220 surrounds the movable body 210. The movable body 210 is inserted into the fixed body 220 and held by the fixed body 220. The circuit board 100 may be mounted on an outer surface of the fixed body 220. The circuit board 100 and the circuit board 270 include, for example, a flexible printed circuit (FPC). Typically, the circuit board 270 transmits a signal for swinging the movable body 210. The circuit board 100 transmits a signal obtained in the optical element 10.

The circuit board 100 is separated from the fixed body 220 and surrounds the fixed body 220. Therefore, the circuit board 100 is located apart from the fixed body 220 radially outward of the fixed body 220 with respect to the fixed body 220. With this configuration, the circuit board 100 can be prevented from coming into contact with the fixed body 220.

Figure 3:
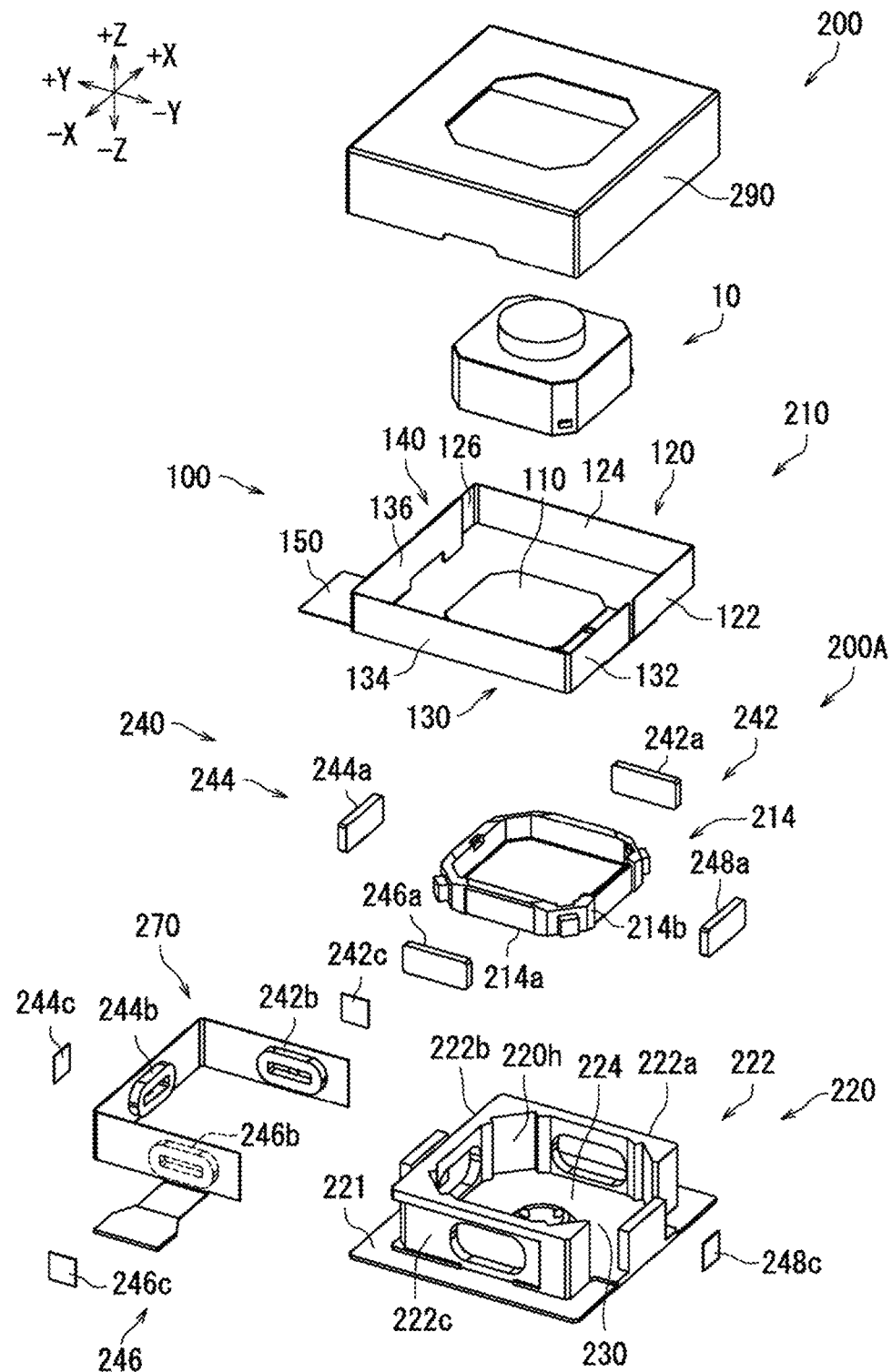
FIG. 3 is a schematic exploded perspective view of an optical assembly of an example embodiment of the present disclosure.

Next, the optical assembly 200 according to the present example embodiment will be described with reference to FIGS. 1 to 3. FIG. 3 is a schematic exploded perspective view of the optical assembly 200 of the present example embodiment.

As illustrated in FIG. 3, the optical assembly 200 includes the movable body 210 including the optical element 10, the fixed body 220 that swingably supports the movable body 210, a swing mechanism 240 that swings the movable body 210 with respect to the fixed body 220, and the circuit board 100 connected to the movable body 210. With this configuration, the circuit board 100 can be used for the optical assembly 200. The optical assembly 200 further includes a support mechanism 230, the swing mechanism 240, the circuit board 270, and the housing case 290.

The movable body 210 includes the optical element 10 and a holder 214. The optical element 10 and the circuit board 100 are housed in the holder 214. The holder 214 holds the optical element 10.

The optical element 10 includes at least an imaging element. Such an optical element 10 is also called a camera module.

The support mechanism 230 supports the movable body 210 with respect to the fixed body 220. The swing mechanism 240 swings the movable body 210 with respect to the fixed body 220.

Note that in the present specification, the optical assembly 200 includes the circuit board 100, the holder 214, the fixed body 220, the support mechanism 230, the swing mechanism 240, the circuit board 270, and the housing case 290. The circuit board 100 can be mounted on a camera module with an image stabilization function.

Here, the movable body 210 has a thin substantially rectangular parallelepiped shape. The movable body 210 has an axisymmetric structure centered on the Z-axis. The length of the movable body 210 along the X-axis direction is substantially equal to the length of the movable body 210 along the Y-axis direction. Further, the length of the movable body 210 along the Z-axis direction is smaller than the length of the movable body 210 along the X-axis direction or the Y-axis direction.

The movable body 210 includes the optical element 10 and a holder 214. The optical element 10 is housed in the holder 214. The holder 214 holds the optical element 10.

The optical element 10 has a substantially rectangular parallelepiped shape including a protrusion in a part thereof.

The holder 214 houses the optical element 10. The holder 214 has a substantially hollow rectangular parallelepiped shape in which a part of a surface on one side is open.

The holder 214 includes a bottom part 214a and a side part 214b. The side part 214b protrudes in the +Z direction from the outer edge of the bottom part 214a. The bottom part 214a faces the fixed body 220.

Here, at least a part of a bottom surface of the optical element 10 is in contact with at least a part of the bottom part 214a of the holder 214. As a result, the optical element 10 is supported by the bottom part 214a of the holder 214. The holder 214 has an axisymmetric structure centered on the Z-axis.

The optical element 10 incorporates an imaging element. The circuit board 100 includes a plurality of wirings. The plurality of wirings are insulated from each other. The circuit board 100 transmits a signal generated in the imaging element. Furthermore, the circuit board 100 transmits a signal for driving the imaging element. A part of the circuit board 100 is arranged between the optical element 10 and the holder 214.

The imaging element in the optical element 10 is electrically connected to the circuit board 100. The circuit board 100 faces an upper surface of the bottom part 214a of the holder 214.

The circuit board 100 includes a first wiring board 110, a second wiring board 120, a third wiring board 130, a connector 140, and an external terminal connector 150. An external terminal is connected to the external terminal connector 150. The circuit board 100 can output an imaging signal acquired by the optical element 10 to the external terminal.

The first wiring board 110 has a thin plate shape spreading on the XY plane. The optical element 10 is placed on the first wiring board 110. The optical element 10 is arranged on the +Z direction side of the first wiring board 110. The first wiring board 110 is sandwiched between the optical element 10 and the holder 214.

The second wiring board 120 is connected to the first wiring board 110. Here, the second wiring board 120 is connected to the first wiring board 110 in the −Y direction. The second wiring board 120 is located on the +X direction side of the first wiring board 110.

The third wiring board 130 is connected to the first wiring board 110. Here, the third wiring board 130 is connected to the first wiring board 110 in the −Y direction. The third wiring board 130 is located on the −X direction side of the first wiring board 110.

The connector 140 connects the second wiring board 120 and the third wiring board 130. Here, the connector 140 connects the second wiring board 120 and the third wiring board 130 in the +Y direction.

The external terminal connector 150 is connected to at least one of the second wiring board 120 and the third wiring board 130. An external terminal is connected to the external terminal connector 150. A signal from the imaging element of the optical element 10 and power to the imaging element can be input and output by the external terminal. The external terminal connector 150 is located on the +Y direction side of the first wiring board 110. The external terminal connector 150 is connected to the second wiring board 120 and the third wiring board 130.

Some wirings of the first wiring board 110 pass through one of the second wiring board 120 and the third wiring board 130 and are electrically connected to the external terminal connector 150. Other wirings of the first wiring board 110 pass through the other of the second wiring board 120 and the third wiring board 130, an insulating member, and one of the second wiring board 120 and the third wiring board 130 to be electrically connected to the external terminal connector 150.

The fixed body 220 includes an opening 220h. The movable body 210 is placed inside the fixed body 220. Typically, the movable body 210 is inserted into the fixed body 220 along the opening 220h of the fixed body 220.

The fixed body 220 includes a bottom part 221 and a side part 222. The bottom part 221 spreads on the XY plane. The bottom part 221 has a thin plate shape. The side part 222 protrudes in the +Z direction from the bottom part 221.

The side part 222 includes a first side part 222a, a second side part 222b, and a third side part 222c. When the movable body 210 is mounted on the fixed body 220, the first side part 222a, the second side part 222b, and the third side part 222c are located around the movable body 210. The second side part 222b is connected to the first side part 222a, and the third side part 222c is connected to the second side part 222b.

The first side part 222a is located in the +X direction of the movable body 210. The first side part 222a is provided with a through hole. The second side part 222b is located in the +Y direction of the movable body 210. The second side part 222b is provided with a through hole. The third side part 222c is located in the −X direction of the movable body 210. The third side part 222c is provided with a through hole.

As described above, in a case where the movable body 210 is mounted on the fixed body 220, three sides of the movable body 210 are surrounded by the first side part 222a, the second side part 222b, and the third side part 222c. On the other hand, no side part is provided on the −Y direction side of the movable body 210. Note, however, that a side part may be provided on the −Y direction side of the movable body 210.

The support mechanism 230 supports the movable body 210. The support mechanism 230 is arranged on the fixed body 220. Typically, the support mechanism 230 is arranged on the bottom part 221 of the fixed body 220. Here, the support mechanism 230 supports the movable body 210 on the same circumference.

For example, the support mechanism 230 may be bonded to the fixed body 220 by an adhesive. Alternatively, the support mechanism 230 may be resin-molded integrally with the fixed body 220. That is, the support mechanism 230 and the fixed body 220 may be a single member. When the support mechanism 230 is arranged on the fixed body 220, the support mechanism 230 protrudes toward the movable body 210 from the fixed body 220. For this reason, even when the movable body 210 swings with respect to the fixed body 220, it is possible to prevent the movable body 210 from colliding with the fixed body 220.

The swing mechanism 240 causes the movable body 210 to swing with respect to the fixed body 220. Due to the swing mechanism 240, the movable body 210 swings with respect to the fixed body 220. At this time, the rotation center of the movable body 210 is on the optical axis Pa.

The swing mechanism 240 swings the movable body 210 with respect to the fixed body 220. The swing mechanism 240 can swing the movable body 210 with respect to the fixed body 220 with reference to the rotation center.

In an optical device including the optical element 10, when the optical device is inclined at the time of imaging, the optical element 10 is inclined, and the captured image is disturbed. In order to avoid disturbance of the captured image, the optical assembly 200 corrects the inclination of the optical element 10 on the basis of the acceleration, the angular velocity, the shake amount, and the like detected by detection means such as a gyroscope. In the present example embodiment, the optical assembly 200 corrects the inclination of the optical element 10 by swinging (rotating) the movable body 210 in a rotation direction (pitching direction) with the X-axis as the rotation axis, a rotation direction (yawing direction) with the Y-axis as the rotation axis, and a rotation direction (rolling direction) with the Z-axis as the rotation axis.

For example, correction of pitching, yawing, and rolling of the movable body 210 is performed as described below. When shake in at least one of the pitching direction, the yawing direction, and the rolling direction occurs in the optical assembly 200, the shake is detected by a magnetic sensor (Hall element) (not illustrated), and based on a result of the detection, the swing mechanism 240 is driven to swing the movable body 210. Note that the shake of the optical assembly 200 may be detected using a shake detection sensor (gyroscope) or the like. A current is supplied to the swing mechanism 240 on the basis of the detection result of the shake to correct the shake.

Note that a swing mechanism other than the swing mechanism 240 may swing the movable body 210 with respect to the fixed body 220. The X-axis direction is a direction orthogonal to the optical axis direction Dp in which the optical axis Pa of the optical element 10 extends, and is an axis of rotation in the pitching direction. The Y-axis direction is a direction orthogonal to the optical axis direction Dp in which the optical axis Pa of the optical element 10 extends, and is an axis of rotation in the yawing direction. The Z-axis direction is parallel to the optical axis direction Dp and is an axis of rotation in the rolling direction.

As described above, the optical assembly 200 of the present example embodiment includes the movable body 210, the fixed body 220, the support mechanism 230, and the swing mechanism 240. The movable body 210 is arranged so as to be movable with respect to the fixed body 220. The support mechanism 230 supports the movable body 210. The swing mechanism 240 swings the movable body 210 with respect to the fixed body 220. The movable body 210 includes the optical element 10 and a holder 214. The optical element 10 has an optical axis Pa. The holder 214 holds the optical element 10.

The holder 214 includes a bottom part 214a and a side part 214b. The support mechanism 230 supports the bottom part 214a of the holder 214.

The swing mechanism 240 causes the movable body 210 to swing with respect to the fixed body 220. The swing mechanism 240 includes a first swing mechanism 242, a second swing mechanism 244, and a third swing mechanism 246. The first swing mechanism 242, the second swing mechanism 244, and the third swing mechanism 246 swing the movable body 210 with respect to the fixed body 220 around different axes.

The first swing mechanism 242 swings the movable body 210 with respect to the fixed body 220. The first swing mechanism 242 swings the movable body 210 around the Y-axis in a state where the rotation center of the movable body 210 is fixed in the XZ plane. Here, the Y-axis direction is an axis of rotation in the yawing direction. The first swing mechanism 242 is located on the +X direction side of the movable body 210.

The first swing mechanism 242 includes a magnet 242a and a coil 242b. The magnet 242a is magnetized such that the magnetic pole of a surface facing radially outward is different on either side of a magnetization polarization line extending along the Y-axis direction. An end on one side along the Z-axis direction of the magnet 242a has one polarity, and an end on the other side has the other polarity.

The magnet 242a is arranged on the +X direction side of the side part 214b of the holder 214. The coil 242b is arranged on the circuit board 270. The coil 242b is located in a through hole penetrating the first side part 222a of the fixed body 220.

By controlling the direction and the magnitude of the current flowing through the coil 242b, the direction and the magnitude of a magnetic field generated from the coil 242b can be changed. Hence, the first swing mechanism 242 swings the movable body 210 around the Y-axis by the interaction between the magnetic field generated from the coil 242b and the magnet 242a.

The second swing mechanism 244 swings the movable body 210 with respect to the fixed body 220. The second swing mechanism 244 swings the movable body 210 around the X-axis in a state where the rotation center of the movable body 210 is fixed in the YZ plane. Here, the X-axis direction is an axis of rotation in the pitching direction. The second swing mechanism 244 is located on the +Y direction side of the movable body 210.

The second swing mechanism 244 includes a magnet 244a and a coil 244b. The magnet 244a is magnetized such that the magnetic pole of a surface facing radially outward is different on either side of a magnetization polarization line extending along the Y-axis direction. An end on one side along the Z-axis direction of the magnet 244a has one polarity, and an end on the other side has the other polarity.

The magnet 244a is arranged on the +Y direction side of the side part 214b of the holder 214. The coil 244b is arranged on the circuit board 270. The coil 244b is located in a through hole penetrating the second side part 222b of the fixed body 220.

By controlling the direction and the magnitude of the current flowing through the coil 244b, the direction and the magnitude of a magnetic field generated from the coil 244b can be changed. Hence, the second swing mechanism 244 swings the movable body 210 around the X-axis by the interaction between the magnetic field generated from the coil 244b and the magnet 244a.

The third swing mechanism 246 swings the movable body 210 with respect to the fixed body 220. Specifically, the third swing mechanism 246 swings the movable body 210 around the Z-axis in a state where the rotation center of the movable body 210 is fixed in the XZ plane. Here, the Z-axis direction is parallel to the optical axis Pa and is an axis of rotation in the rolling direction. The third swing mechanism 246 is located on the −X direction side of the movable body 210.

The third swing mechanism 246 includes a magnet 246a and a coil 246b. The magnet 246a is magnetized such that the magnetic pole of a surface facing radially outward is different on either side of a magnetization polarization line extending along the Z-axis direction. An end on one side along the Y-axis direction of the magnet 246a has one polarity, and an end on the other side has the other polarity.

The magnet 246a is arranged on the −X direction side of the side part 214b of the holder 214. The coil 246b is arranged on the circuit board 270. The coil 246b is located in a through hole penetrating the third side part 222c of the fixed body 220.

By controlling the direction and the magnitude of the current flowing through the coil 246b, the direction and the magnitude of a magnetic field generated from the coil 246b can be changed. Hence, the third swing mechanism 246 swings the movable body 210 around the Z-axis by the interaction between the magnetic field generated from the coil 246b and the magnet 246a.

Note that in the present specification, the magnet 242a, the magnet 244a, and the magnet 246a may be collectively referred to as a magnet 240a. In addition, in the present specification, the coil 242b, the coil 244b, and the coil 246b may be collectively referred to as a coil 240b.

The swing mechanism 240 includes the magnet 240a provided on the movable body 210 and the coil 240b provided on the fixed body 220. Here, the magnet 240a is arranged on the movable body 210, and the coil 240b is arranged on the fixed body 220. Note, however, that the magnet 240a may be arranged on the fixed body 220, and the coil 240b may be arranged on the movable body 210. As described above, one of the magnet 240a and the coil 240b may be arranged on one of the movable body 210 and the fixed body 220, and the other of the magnet 240a and the coil 240b may be arranged on the other of the movable body 210 and the fixed body 220. By controlling the direction and the magnitude of the current flowing through the coil 240b, the direction and the magnitude of a magnetic field generated from the coil 240b can be changed. Therefore, the swing mechanism 240 can swing the movable body 210 by the interaction between the magnetic field generated from the coil 240b and the magnet 240a.

The optical assembly 200 further includes a magnetic body 242c, a magnetic body 244c, and a magnetic body 246c. The magnetic body 242c, the magnetic body 244c, and the magnetic body 246c are arranged on the circuit board 270. The magnetic body 242c is arranged facing the coil 242b in the circuit board 270. The magnetic body 244c is arranged facing the coil 244b in the circuit board 270. The magnetic body 246c is arranged facing the coil 246b in the circuit board 270. The magnetic body 242c, the magnetic body 244c, and the magnetic body 246c may be hard magnetic bodies. That is, the magnetic body 244c and the magnetic body 246c may be permanent magnets.

The optical assembly 200 further includes a magnet 248a and a magnetic body 248c. The magnet 248a is arranged on the −Y direction side of the side part 214b of the holder 214. The magnetic body 248c is arranged on the −Y direction side of the fixed body 220. The magnet 248a and the magnetic body 248c face each other. The magnetic body 248c may be a hard magnetic body. That is, the magnetic body 248c may be a permanent magnet.

The optical assembly 200 corrects shake of the optical element 10 including at least the imaging element. The optical assembly 200 includes the movable body 210, the fixed body 220 that movably supports the movable body 210, and the circuit board 100 connected to the movable body 210. With this configuration, the circuit board 100 can be used for the optical assembly 200.

The circuit board 100 is located radially outward the fixed body 220 and away from the fixed body 220. With this configuration, the circuit board 100 can be prevented from coming into contact with the fixed body 220.

The optical assembly 200 further includes the housing case 290 that houses the circuit board 100. The housing case 290 can reduce exposure of the circuit board 100. In addition, by housing the circuit board 100 in the housing case 290, the circuit board 100 can be easily attached to a smartphone or the like.

The optical assembly 200 further includes a swing mechanism 240 capable of swinging the movable body 210 with respect to the fixed body 220. The swing mechanism 240 can swing the movable body 210.

The swing mechanism 240 includes the first swing mechanism 242 that swings the movable body 210 with respect to the fixed body 220 about the second direction (Y direction), and the second swing mechanism 244 that swings the movable body 210 with respect to the fixed body 220 about the first direction (X direction). As a result, the circuit board 100 can be swung about two axes.

The swing mechanism 240 further includes the third swing mechanism 246 that swings the movable body 210 with respect to the fixed body 220 about the third direction (Z direction). As a result, the circuit board 100 can be swung about three axes.

Figure 4:
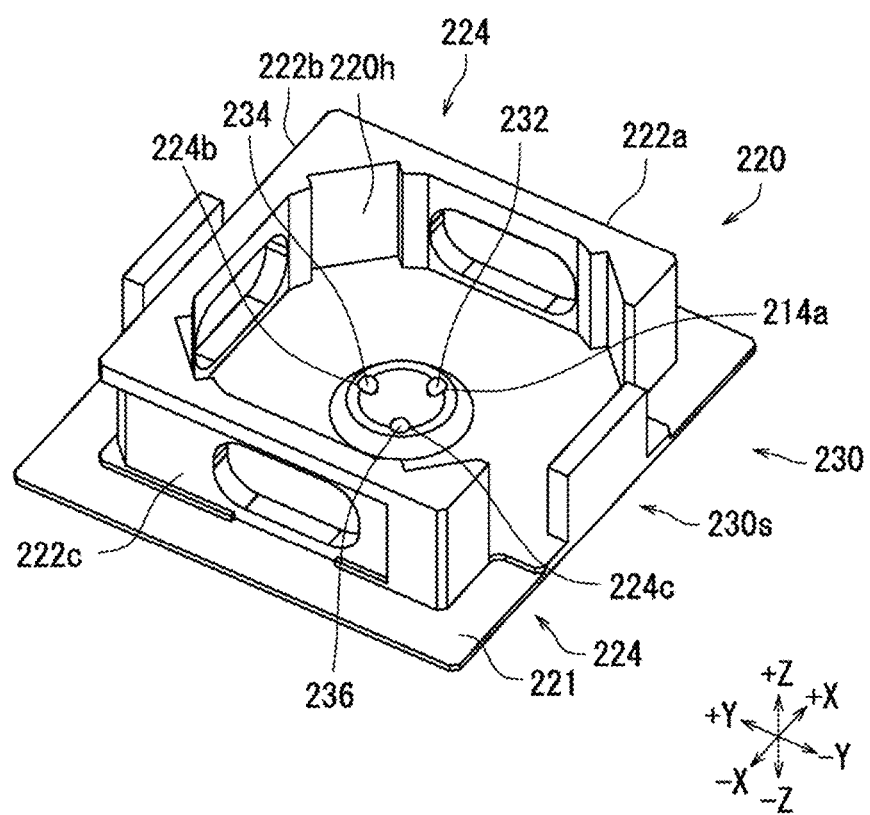
FIG. 4 is a schematic exploded perspective view of a fixed body in an optical assembly of an example embodiment of the present disclosure.

Next, the optical assembly 200 according to the present example embodiment will be described with reference to FIGS. 1 to 4. FIG. 4 is a schematic perspective view of the fixed body 220 in the optical assembly 200 of the present example embodiment. Note that in FIG. 4, the circuit board 270 is omitted to prevent the diagram from being excessively complicated.

As illustrated in FIG. 4, the fixed body 220 includes the bottom part 221, the side part 222, and a recess 224 recessed in the optical axis direction Dp from the bottom part 221. The support mechanism 230 is arranged on the fixed body 220. The support mechanism 230 is arranged in the recess 224 of the fixed body 220. The recess 224 faces the holder 214.

The recess 224 includes a first recess 224a, a second recess 224b, and a third recess 224c. The first recess 224a, the second recess 224b, and the third recess 224c are arranged at equal intervals on the same circumference centered on the optical axis Pa. In the present specification, the first recess 224a, the second recess 224b, and the third recess 224c may be collectively referred to as the recess 224.

The support mechanism 230 supports the movable body 210. The support mechanism 230 is arranged on the fixed body 220. The support mechanism 230 is located between the recess 224 of the fixed body 220 and the holder 214.

The support mechanism 230 protrudes toward the holder 214 from the bottom part 221 of the fixed body 220. Even when the movable body 210 swings with respect to the fixed body 220, it is possible to prevent the movable body 210 from colliding with the fixed body 220.

The support mechanism 230 includes a plurality of supports 230s. The plurality of supports 230s have the same shape. Here, the support mechanism 230 includes a first support 232, a second support 234, and a third support 236. In the present specification, the first support 232, the second support 234, and the third support 236 may be collectively referred to as a support 230s.

The first support 232, the second support 234, and the third support 236 are arranged in the first recess 224a, the second recess 224b, and the third recess 224c, respectively. Therefore, the first support 232, the second support 234, and the third support 236 are arranged at equal intervals on the same circumference centered on the optical axis Pa. Accordingly, the movable body 210 can be stably supported with respect to the fixed body 220.

The first support 232, the second support 234, and the third support 236 have a sphere shape or a shape of a part of a sphere. The spherical parts of the first support 232, the second support 234, and the third support 236 come into contact with the holder 214, so that the movable body 210 can slide with respect to the support mechanism 230.

The support mechanism 230 includes a plurality of supports 230s arranged on the same circumference with respect to the optical axis Pa. The plurality of supports 230s are located radially outward of the center of the holder 214. The support 230s arranged on the same circumference can securely support the optical element 10.

The support 230s has a spherical shape or a shape of a part of a sphere. Therefore, the movable body 210 can be slid by the support 230s.

Figure 5A:
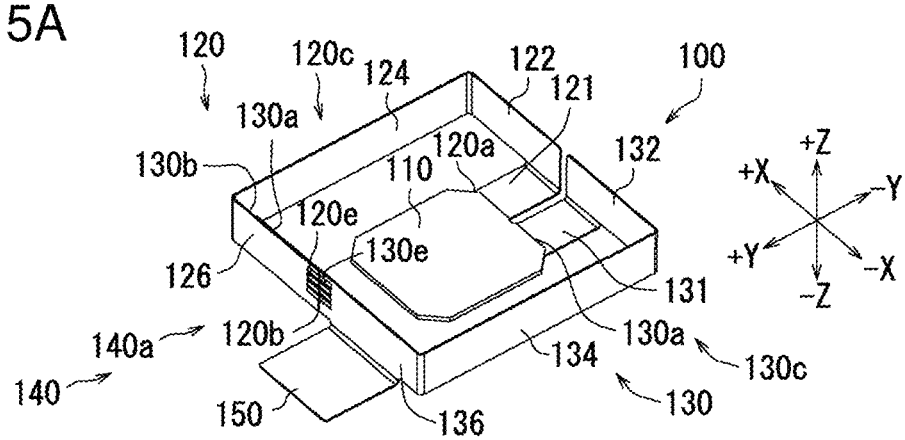
FIG. 5A is a schematic perspective view of a circuit board according to an example embodiment of the present disclosure.
Figure 5B:
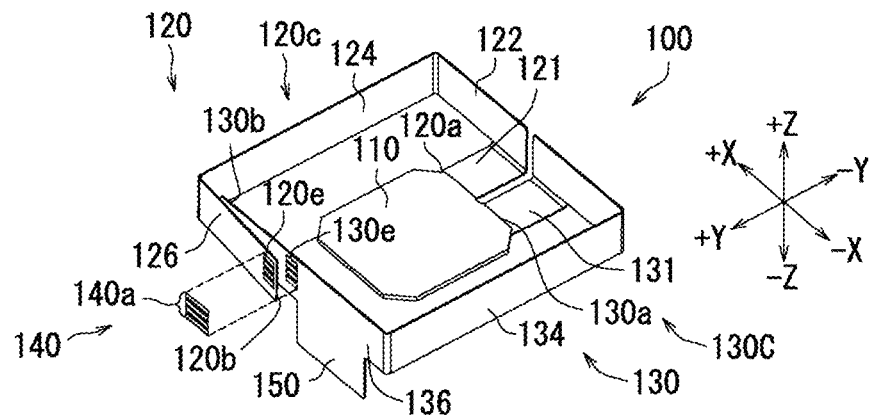
FIG. 5B is a schematic perspective view of a circuit board according to an example embodiment of the present disclosure.
Figure 5C:
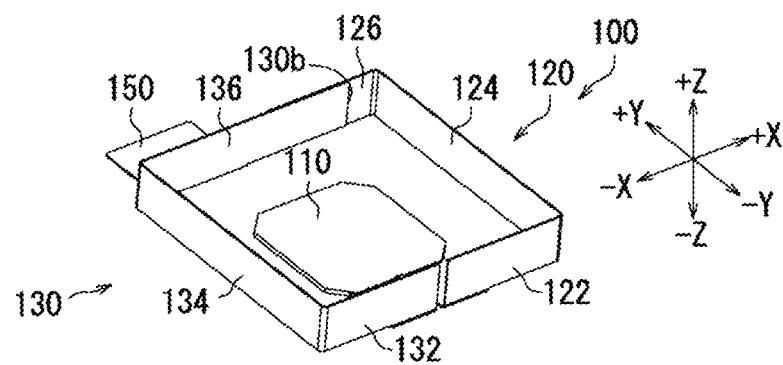
FIG. 5C is a schematic perspective view of a circuit board according to an example embodiment of the present disclosure.

Next, the circuit board 100 of the present example embodiment will be described with reference to FIGS. 1 to 5C. FIGS. 5A to 5C are schematic perspective views of the circuit board 100 according to the present example embodiment. Note that FIG. 5B illustrates a state of the circuit board 100 of the present example embodiment before the external terminal connector 150 is bent, and before an exposed portion 120e of the second wiring board 120 and an exposed portion 130e of the third wiring board 130 are covered with a solder 140a to connect the second wiring board 120 and the third wiring board 130 with each other.

As illustrated in FIGS. 5A to 5C, the circuit board 100 includes the first wiring board 110, the second wiring board 120 connected to the first wiring board 110, the third wiring board 130 connected to the first wiring board 110, the connector 140, and the external terminal connector 150.

Each of the first wiring board 110, the second wiring board 120, and the third wiring board 130 includes at least one or more wires. Typically, in the first wiring board 110, the second wiring board 120, and the third wiring board 130, a plurality of wirings extend in the longitudinal direction while being insulated from one another. The wirings of the first wiring board 110, the second wiring board 120, and the third wiring board 130 are covered with an insulating film except for specific parts.

The first wiring board 110 has a thin plate shape spreading on the XY plane. The normal line of the first wiring board 110 extends in the Z direction. The second wiring board 120 partially surrounds the first wiring board 110 in the +X direction. The third wiring board 130 partially surrounds the first wiring board 110 in the −X direction.

The second wiring board 120 has one end 120a, the other end 120b, and a main body part 120c. The one end 120a of the second wiring board 120 is connected to the first wiring board 110. The other end 120b of the second wiring board 120 overlaps the third wiring board 130.

The main body part 120c is a part located between the one end 120a and the other end 120b. The main body part 120c has a part 121, a part 122, a part 124, and a part 126. The part 122, the part 124, and the part 126 are located on the +X direction side of the first wiring board 110. Typically, the part 122, the part 124, and the part 126 of the second wiring board 120 are formed by bending a linear wiring board. Typically, the width (length in Z direction) of the part 122, the part 124, and the part 126 is substantially constant.

Here, the part 121 is connected to the first wiring board 110. The part 121 extends from the first wiring board 110 to the other side in the second direction (−Y direction).

The part 122 extends in the first direction (X direction). Specifically, the part 122 extends from the part 121 in the first direction (X direction) orthogonal to the second direction (Y direction). Specifically, the part 122 is bent toward the +Z direction side from the part 121 and extends in the +X direction.

The part 124 extends from the part 122 in a direction intersecting the extending direction of the part 122. For example, the part 124 extends from the part 122 in the second direction (Y direction) orthogonal to the first direction (X direction). Specifically, the part 124 extends from the part 122 to one side (+Y direction) in the second direction.

The part 126 extends from the part 124 in a direction intersecting the extending direction of the part 124. For example, the part 126 extends from the part 124 in the first direction (X direction) orthogonal to the second direction (Y direction). Specifically, the part 126 extends from the part 124 to the other side (−X direction) of the first direction orthogonal to the second direction (Y direction).

Similarly, the third wiring board 130 has one end 130a, the other end 130b, and a main body part 130c. The one end 130a of the third wiring board 130 is connected to the first wiring board 110. The other end 130b of the third wiring board 130 overlaps the second wiring board 120.

The main body part 130c is a part located between the one end 130a and the other end 130b. The main body part 130c has a part 132, a part 134, and a part 136. The part 132, the part 134, and the part 136 are located on the −X direction side of the first wiring board 110. Typically, the part 132, the part 134, and the part 136 of the third wiring board 130 are formed by bending a linear wiring board. Typically, the width (length in Z direction) of the part 132, the part 134, and the part 136 is substantially constant.

Here, a part 131 is connected to the first wiring board 110. The part 131 extends from the first wiring board 110 to the other side in the second direction (−Y direction).

The part 132 extends from the part 131 in the first direction (X direction). Specifically, the part 132 is bent toward the +Z direction side from the part 131 and extends in the −X direction.

The part 134 extends from the part 132 in a direction intersecting the extending direction of the part 132. For example, the part 134 extends from the part 132 in the second direction (Y direction). Specifically, the part 134 extends from the part 132 to one side (+Y direction) in the second direction.

The part 136 extends from the part 134 in a direction intersecting the extending direction of the part 134. For example, the part 136 extends from the part 134 in the first direction (X direction) orthogonal to the second direction (Y direction). Specifically, the part 136 extends from the part 134 to one side (+X direction) of the first direction orthogonal to the second direction (Y direction).

The part 122 of the second wiring board 120 extends in a direction different from the extending direction of the part 132 of the third wiring board 130. In the present specification, the part 122 may be referred to as a reference portion. In addition, in the present specification, the part 132 may be referred to as a different-direction reference portion. Note that here, while the part 122 is located between the part 121 and the part 124 in the second wiring board 120 in this example, the present example embodiment is not limited thereto. The part 122 may be directly connected to the first wiring board 110. Alternatively, the part 122 may be connected to the part 121 via another part. Similarly, while the part 132 is located between the part 131 and the part 134 in the third wiring board 130, the present example embodiment is not limited thereto. The part 132 may be directly connected to the first wiring board 110. Alternatively, the part 132 may be connected to the part 131 via another part.

As described above, the second wiring board 120 includes the one end 120a, the other end 120b, and the reference portion 122. The one end 120a of the second wiring board 120 is connected to the first wiring board 110. The reference portion 122 of the second wiring board 120 is located in any position between the one end 120a of the second wiring board 120 and the other end 120b of the second wiring board 120.

The third wiring board 130 includes the one end 130a, the other end 130b, and the different-direction reference portion 132. The one end 130a of the third wiring board 130 is connected to the first wiring board 110. The different-direction reference portion 132 of the third wiring board 130 extends in a direction different from the extending direction of the reference portion 122 in any position between the one end 130a of the third wiring board 130 and the other end 130b of the third wiring board 130.

The connector 140 connects the second wiring board 120 and the third wiring board 130. The connector 140 is superimposed on a part where the second wiring board 120 and the third wiring board 130 overlap.

The connector 140 connects any part between the reference portion 122 and the other end 120b of the second wiring board 120 in the second wiring board 120 and any part between the different-direction reference portion 132 and the other end 130b of the third wiring board 130 in the third wiring board 130. Here, the connector 140 connects a part of the part 126 of the second wiring board 120 and a part of the part 136 of the third wiring board 130.

The connector 140 includes the solder 140a. The solder 140a covers the exposed portion 120e of the second wiring board 120 and the exposed portion 130e of third wiring board 130. In the second wiring board 120, the wiring is exposed from the exposed portion 120e.

Here, in the third wiring board 130, the wiring is exposed from the exposed portion 130e. In a state where the second wiring board 120 and the third wiring board 130 are bent, the exposed portion 120e of the second wiring board 120 and the exposed portion 130e of the third wiring board 130 are adjacent to each other. Here, the exposed portion 120e of the second wiring board 120 and the exposed portion 130e of the third wiring board 130 are arranged side by side in the X direction on the +Y direction side. The solder 140a covers exposed portion 120e of the second wiring board 120 and the exposed portion 130e of third wiring board 130 arranged side by side. As a result, a signal passing from the first wiring board 110 through the second wiring board 120 can be transmitted to the external terminal connector 150 via the solder 140a and the third wiring board 130.

Here, the external terminal connector 150 extends from the third wiring board 130 in a direction (Y direction) different from the direction (X direction) in which the second wiring board 120 and the third wiring board 130 are connected by the connector 140, and is connected to the external terminal. Specifically, the external terminal connector 150 extends from the part 136 of the third wiring board 130 in a direction (Y direction) different from the direction (X direction) in which the second wiring board 120 and the third wiring board 130 are connected by the connector 140, and is connected to the external terminal. In one example, the external terminal connector 150 and the third wiring board 130 may be a single member, and the external terminal connector 150 may be formed by being bent with respect to the part 136.

The external terminal connector 150 is preferably located in a region different from the connector 140. The position of the external terminal connector 150 in the X direction does not overlap the position of the connector 140 in the X direction.

Note that while the connector 140 connects the second wiring board 120 and the third wiring board 130 in the +Y direction in which the part 126 of the second wiring board 120 and the part 136 of the third wiring board 130 overlap each other in the circuit board 100 illustrated in FIGS. 5A to 5C, the present example embodiment is not limited thereto. The second wiring board 120 and the third wiring board 130 may overlap each other in another location, and the connector 140 may connect the second wiring board 120 and the third wiring board 130 in the location where the second wiring board 120 and the third wiring board 130 overlap each other. For example, the second wiring board 120 and the third wiring board 130 may be connected to the first wiring board 110 on the +X direction side. Alternatively, the second wiring board 120 and the third wiring board 130 may be connected to the first wiring board 110 on the −X direction side.

In this manner, the connector 140 electrically connects any part of the second wiring board 120 between the reference portion 122 and the other end 120b of the second wiring board 120 and any part of the third wiring board 130 between the different-direction reference portion 132 and the other end 130b of the third wiring board 130.

Note that while the external terminal connector 150 extends from the part 136 of the third wiring board 130 in the circuit board 100 illustrated in FIGS. 5A to 5C, the present example embodiment is not limited thereto. The external terminal connector 150 may extend from another part of the third wiring board 130. Alternatively, the external terminal connector 150 may extend from a part of the second wiring board 120. In this case, the external terminal connector 150 preferably extends from the part 126 corresponding to the other end 120b of the second wiring board 120.

As described above, the external terminal connector 150 extends from one of the second wiring board 120 and the third wiring board 130 in a direction different from the direction in which the second wiring board 120 and the third wiring board 130 are connected by the connector 140, and is connected to the external terminal. According to the circuit board 100 of the present example embodiment, it is possible to connect to the external terminal at one connection part with a simple configuration.

The one end 120a of the second wiring board 120 and the one end 130a of the third wiring board 130 are located on one side of the first wiring board 110. Specifically, the one end 120a of the second wiring board 120 and the one end 130a of the third wiring board 130 are located on the −Y direction side of the first wiring board 110. On the other hand, here, the other end 120b of the second wiring board 120 and the other end 130b of the third wiring board 130 are located on the other side of the first wiring board 110. Specifically, the other end 120b of the second wiring board 120 and the other end 130b of the third wiring board 130 are located on the +Y direction side of the first wiring board 110.

As described above, since the second wiring board 120 and the third wiring board 130 connected by the connector 140 surround the first wiring board 110, the second wiring board 120 and the third wiring board 130 move in a linked manner according to the movement of the first wiring board 110. Hence, it is possible to reduce the elastic resistance of the circuit board 100 when the first wiring board 110 moves.

The reference portion 122 of the second wiring board 120 extends to one side (+X direction) in the first direction with respect to the first wiring board 110. The different-direction reference portion 132 of the third wiring board 130 extends to the other side (−X direction) in the first direction with respect to the first wiring board 110. Since the reference portion 122 of the second wiring board 120 extends in a direction opposite to the extending direction of the different-direction reference portion 132 of the third wiring board 130, the first wiring board 110 can be moved symmetrically with respect to the second wiring board 120 and the third wiring board 130.

In the connector 140, the second wiring board 120 and the third wiring board 130 are connected in the first direction (X direction). Therefore, the second wiring board 120 and the third wiring board 130 can be electrically connected easily.

As described above, the second wiring board 120 further includes the part 124 extending from the reference portion 122 to one side (+Y direction) of the second direction intersecting the first direction with respect to the reference portion 122. Here, the second wiring board 120 further includes the part 124 extending from the reference portion 122 to one side (+Y direction) of the Y direction orthogonal to the X direction with respect to the reference portion 122.

Similarly, the third wiring board 130 further includes the part 134 extending from the different-direction reference portion 132 to one side (+Y direction) of the second direction with respect to the different-direction reference portion 132. Here, the third wiring board 130 further includes the part 134 extending from the different-direction reference portion 132 to one side (+Y direction) in the Y direction orthogonal to the X direction with respect to the different-direction reference portion 132. Since the second wiring board 120 and the third wiring board 130 have the parts 124 and 134 extending in the same direction along the second direction (Y direction), the elastic resistance of the circuit board 100 when the first wiring board 110 moves can be reduced.

Here, the second direction (Y direction) is orthogonal to the first direction (X direction). Since the second direction (Y direction) is orthogonal to the first direction (X direction), the elastic resistance of the circuit board 100 when the first wiring board 110 moves can be reduced.

For example, one of the second wiring board 120 and the third wiring board 130 and the external terminal connector 150 are a single member. The circuit board 100 can be manufactured by cutting out one circuit board.

The external terminal connector 150 extends from a position different from the connector 140 in one of the second wiring board 120 and the third wiring board 130. Since the external terminal connector 150 can be arranged at a position shifted from the connector 140, the degree of freedom in design is improved.

The second wiring board 120 has the exposed portion 120e located between the reference portion 122 and the other end 120b. The third wiring board 130 has the exposed portion 130e located between the different-direction reference portion 132 and the other end 130b. The connector 140 includes the solder 140a covering the exposed portion 120e of the second wiring board 120 and the exposed portion 130e of the third wiring board 130. With this configuration, the second wiring board 120 and the third wiring board 130 can be physically and electrically connected by the solder 140a.

The circuit board 100 has an axisymmetric structure in the third direction (Z direction). With the above configuration, it is possible to curb deviation of the elastic resistance (rotational resistance) of the circuit board 100 with respect to the rotation about the third direction (Z direction).

Note that any one of the first wiring board 110, the second wiring board 120, the third wiring board 130, and the external terminal connector 150 of the circuit board 100 may be formed by bending one circuit board. Some of the first wiring board 110, the second wiring board 120, the third wiring board 130, and the external terminal connector 150 of the circuit board 100 may be formed integrally from one circuit board by bending one circuit board. Alternatively, when any two of the first wiring board 110, the second wiring board 120, the third wiring board 130, and the external terminal connector 150 are connected as separate members, solder may be used for the connection. This enables easy connection.

Figure 6:
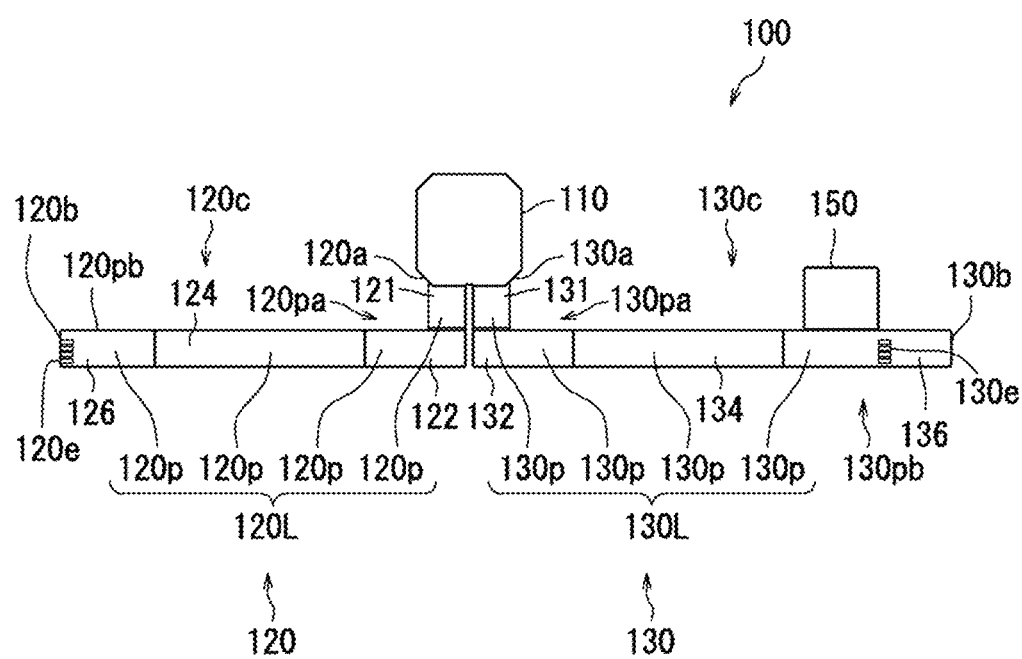
FIG. 6 is a schematic developed view of a circuit board according to an example embodiment of the present disclosure.

Next, the circuit board 100 of the present example embodiment will be described with reference to FIGS. 1 to 6. FIG. 6 is a schematic developed view of the circuit board 100 of the present example embodiment.

As illustrated in FIG. 6, the circuit board 100 includes a linear plate 120L and a linear plate 130L.

The second wiring board 120 has a plurality of linear plate portions 120p in which the linear plate 120L extending in the longitudinal direction is bent at a plurality of positions. Among the plurality of linear plate portions 120p of the second wiring board 120, a linear plate portion 120pa located at the one end 120a of the second wiring board 120 is connected to the first wiring board 110.

The third wiring board 130 has a plurality of linear plate portions 130p in which the linear plate 130L extending in the longitudinal direction is bent at a plurality of positions. Among the plurality of linear plate portions 130p of the third wiring board 130, a linear plate portion 130pa located at the one end 130a of the third wiring board 130 is connected to the first wiring board 110.

When the circuit board 100 is produced by bending the linear plate 120L and the linear plate 130L, a linear plate portion 120pb located at the other end 120b of the second wiring board 120 among the plurality of linear plate portions 120p of the second wiring board 120 is connected to a linear plate portion 130pb located at the other end 130b of the third wiring board 130 among the plurality of linear plate portions 130p of the third wiring board 130. Since the end part of the bent linear plate portion of the second wiring board 120 is connected to the end part of the bent linear plate portion of the third wiring board 130, the second wiring board 120 and the third wiring board 130 can be connected firmly.

The length of the linear plate 120L of the second wiring board 120 is different from the length of the linear plate 130L of the third wiring board 130. The second wiring board 120 and the third wiring board 130 can have different lengths.

The external terminal connector 150 is located on a side surface of the part 136 on the first wiring board 110 side (or part 131 side) when the linear plate 130L is developed. The external terminal connector 150 extends from the longer one of the linear plate 120L of the second wiring board 120 and the linear plate 130L of the third wiring board 130. Here, the external terminal connector 150 extends from the linear plate 130L which is the longer one of the linear plate 120L and the linear plate 130L. Therefore, since the connection with the external terminal can be facilitated, the degree of freedom in design is improved.

The external terminal connector 150 extends from the linear plate portion 120pb positioned at the other end 120b of the second wiring board 120 among the plurality of linear plate portions 120p of the second wiring board 120 or the linear plate portion 130pb positioned at the other end 130b of the third wiring board 130 among the plurality of linear plate portions 130p of the third wiring board 130. The external terminal connector 150 can be arranged on the same surface as the connector 140.

Figure 7:
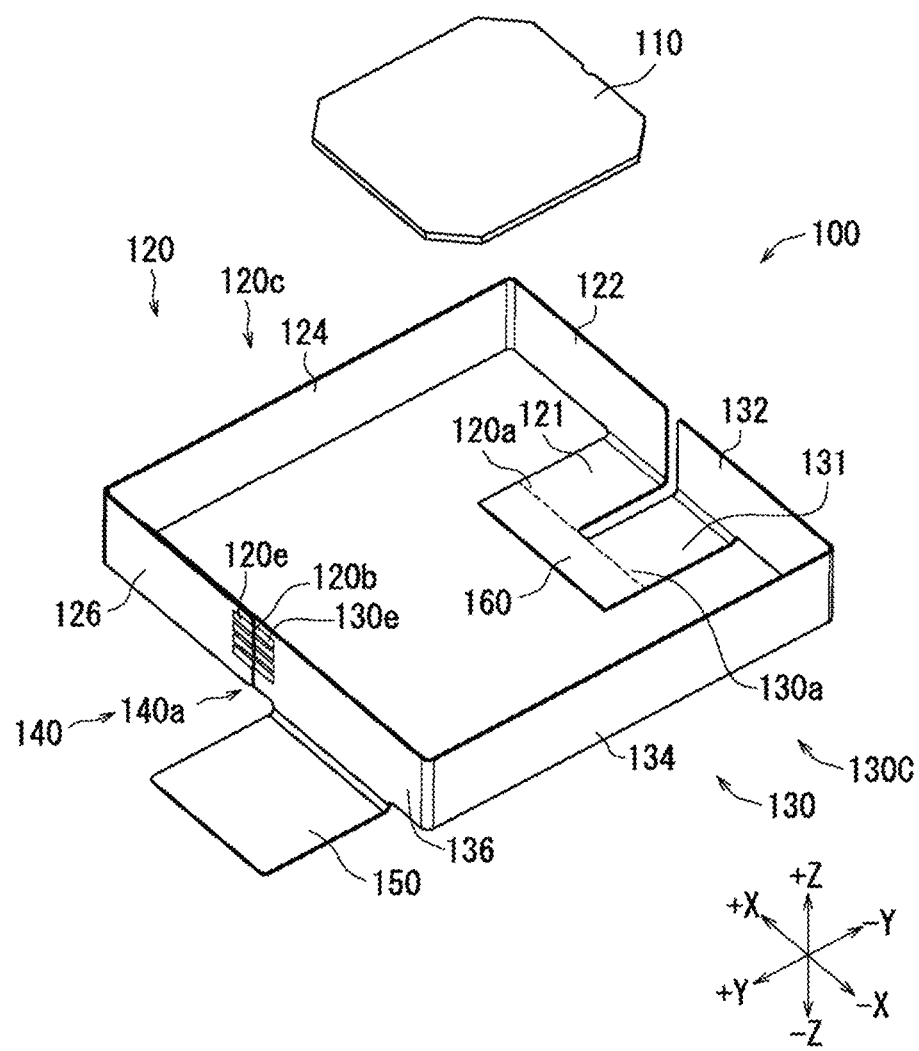
FIG. 7 is a schematic exploded view of a circuit board according to an example embodiment of the present disclosure.

Next, the circuit board 100 of the present example embodiment will be described with reference to FIGS. 1 to 7. FIG. 7 is a schematic exploded perspective view of the circuit board 100 of the present example embodiment. The circuit board 100 of FIG. 7 has the same configuration as the circuit board 100 described above with reference to FIG. 5A and other drawings except that a coupling portion 160 is further provided, and overlapping description is omitted to avoid redundancy.

As illustrated in FIG. 7, the circuit board 100 further includes, in addition to the first wiring board 110, the second wiring board 120, the third wiring board 130, the connector 140, and the external terminal connector 150, a coupling portion 160 that couples the second wiring board 120 and the third wiring board 130 in the first wiring board 110. The connection strength between the first wiring board 110 and the second wiring board 120 and third wiring board 130 can be improved by the coupling portion 160. Furthermore, since the second wiring board 120 and the third wiring board 130 are coupled by the coupling portion 160, noise generation can be curbed even when the circuit board 100 moves.

The first wiring board 110, the second wiring board 120, and the third wiring board 130 are electrically connected via the coupling portion 160. The coupling portion 160 is located on the −Z direction side of the first wiring board 110. The coupling portion 160 connects the first wiring board 110 and each of the second wiring board 120 and the third wiring board 130. The coupling portion 160 may electrically connect the first wiring board 110 to the second wiring board 120 and the third wiring board 130.

The second wiring board 120 connects the coupling portion 160 and the external terminal connector 150. The third wiring board 130 connects the coupling portion 160 and the external terminal connector 150. The second wiring board 120 is located on the +X direction side of the first wiring board 110. The third wiring board 130 is located on the −X direction side of the first wiring board 110. The second wiring board 120 and the third wiring board 130 surround the first wiring board 110. Specifically, the second wiring board 120 and the third wiring board 130 linearly surround the first wiring board 110.

The coupling portion 160 connects the first wiring board 110 and each of the second wiring board 120 and the third wiring board 130. Note that here, the coupling portion 160 extends in the X direction while having a predetermined length along the Y direction. In addition, here, one coupling portion 160 connects the first wiring board 110, the second wiring board 120, and the third wiring board 130. Note, however, that the coupling portion 160 may be separated into a plurality of parts and connect the first wiring board 110, the second wiring board 120, and the third wiring board 130.

Note that while the second wiring board 120 and the third wiring board 130 are connected in one direction in the circuit board 100 illustrated in FIGS. 3 to 7, the present example embodiment is not limited thereto. The second wiring board 120 and the third wiring board 130 may be connected in a plurality of directions.

Figure 8A:
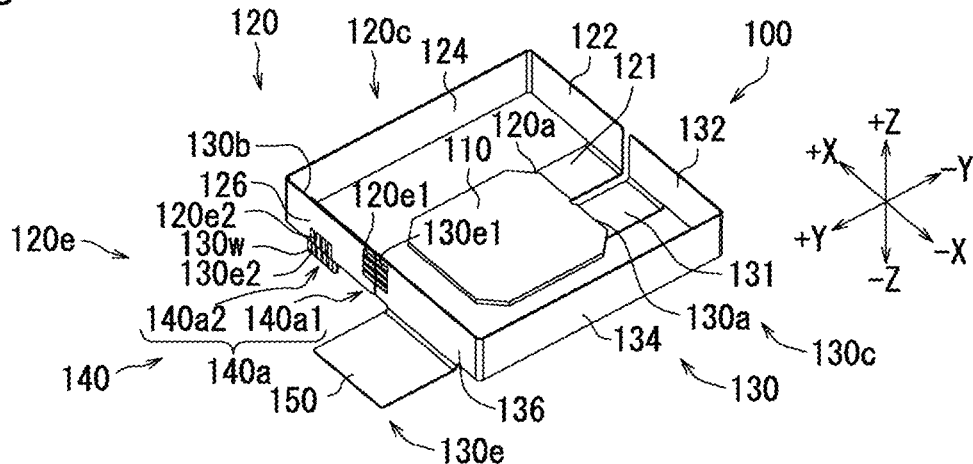
FIG. 8A is a schematic perspective view of a circuit board according to an example embodiment of the present disclosure.
Figure 8B:
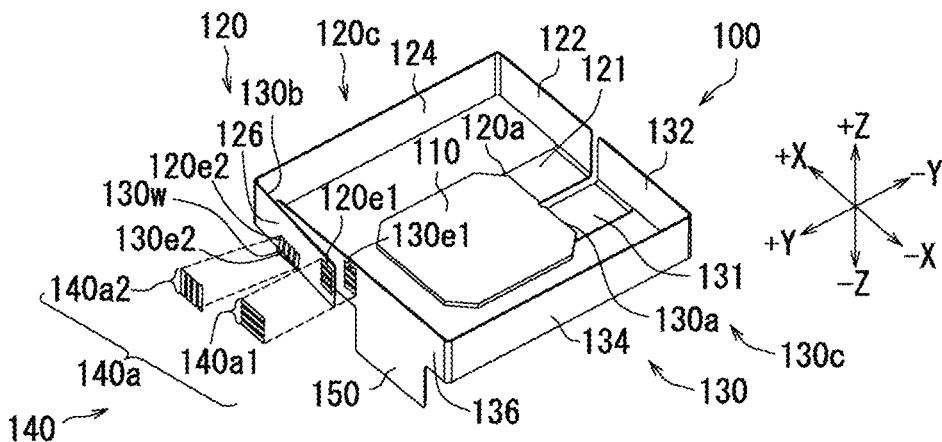
FIG. 8B is a schematic perspective view of a circuit board according to an example embodiment of the present disclosure.
Figure 8C:
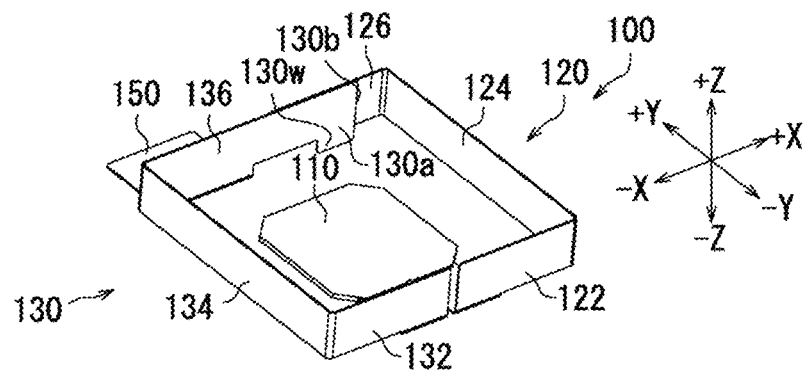
FIG. 8C is a schematic perspective view of a circuit board according to an example embodiment of the present disclosure.

Next, the circuit board 100 of the present example embodiment will be described with reference to FIGS. 1 to 8C. FIGS. 8A to 8C are schematic perspective views of the circuit board 100 according to the present example embodiment. Note that FIG. 8B illustrates a state of the circuit board 100 of the present example embodiment before the external terminal connector 150 is bent, and before a first exposed portion 120e1 and a second exposed portion 120e2 of the second wiring board 120 and a first exposed portion 130e1 and a second exposed portion 130e2 of the third wiring board 130 are covered with solders 140a1 and 140a2 to connect the second wiring board 120 and the third wiring board 130. The circuit board 100 in FIGS. 8A to 8C has the same configuration as the circuit board 100 described above with reference to FIGS. 5A to 5C except that the second wiring board 120 and the third wiring board 130 are connected at a plurality of positions, and overlapping description is omitted to avoid redundancy.

As illustrated in FIGS. 8A to 8C, the circuit board 100 includes the first wiring board 110, the second wiring board 120, the third wiring board 130, the connector 140, and the external terminal connector 150. The connector 140 includes the solder 140a. Here, the solder 140a is divided into the solder 140a1 and the solder 140a2.

Here, the third wiring board 130 has a wide part 130w. The wide part 130w is located in the part 136. The width (length in Z direction) of the wide part 130w is larger than the width of other parts. For example, the width (length in Z direction) of the wide part 130w is larger than the width (length in Z direction) of the parts 132 and 134.

In the third wiring board 130, the wide part 130w is located in a region where the second wiring board 120 and the third wiring board 130 overlap. The width (length in Z direction) of the wide part 130w is larger than the width of a part (part of part 126 in this example) of the second wiring board 120 overlapping the wide part 130w. When the part 126 of the second wiring board 120 overlaps the part 136 of the third wiring board 130, at least the −Z direction-side part of the wide part 130w does not overlap the part 126.

The exposed portion 120e of the second wiring board 120 includes the first exposed portion 120e1 and the second exposed portion 120e2 extending in a direction different from the extending direction of the first exposed portion 120e1. Here, the first exposed portion 120e1 is located in the part 126. Specifically, the first exposed portion 120e1 is located at the other end 120b of the second wiring board 120. The first exposed portion 120e1 is located on the opposite side (+Y direction side) of the first wiring board 110. The first exposed portion 120e1 extends in the X direction.

The second exposed portion 120e2 is located in the part 126. Specifically, the second exposed portion 120e2 is located on the −Z direction side in the surface on the opposite side (+Y direction side) of the first wiring board 110. The second exposed portion 120e2 extends in the Z direction.

The exposed portion 130e of the third wiring board 130 includes the first exposed portion 130e1 and the second exposed portion 130e2 extending in a direction different from the extending direction of the first exposed portion 130e1. Here, the first exposed portion 130e1 is located in the part 136. Specifically, the first exposed portion 130e1 is located at the center of the part 136. The first exposed portion 130e1 extends in the X direction.

The second exposed portion 130e2 is located in the part 136. Specifically, the second exposed portion 130e2 is located on the −Z direction side of the part 136 on the surface on the opposite side (+Y direction side) of the first wiring board 110. The second exposed portion 130e2 is located in a part of the wide part 130w that is not covered by the part 126 of the second wiring board 120. The second exposed portion 130e2 extends in the Z direction.

The solder 140a2 covers the second exposed portion 120e2 of the second wiring board 120 and the second exposed portion 130e2 of the third wiring board 130. The solder 140a2 extends in the Z direction at a position overlapping the second wiring board 120 and the third wiring board 130.

In this manner, the solder 140a covers the first exposed portion 120e1 of the second wiring board 120 and the first exposed portion 130e1 of the third wiring board 130, and covers the second exposed portion 120e2 of the second wiring board 120 and the second exposed portion 130e2 of the third wiring board 130. Specifically, the solder 140a1 covers the first exposed portion 120e1 of the second wiring board 120 and the first exposed portion 130e1 of the third wiring board 130. The solder 140a1 extends in the X direction at a position overlapping the second wiring board 120 and the third wiring board 130. The solder 140a2 covers the second exposed portion 120e2 of the second wiring board 120 and the second exposed portion 130e2 of the third wiring board 130. The solder 140a2 extends in the Z direction at a position overlapping the second wiring board 120 and the third wiring board 130. Accordingly, the second wiring board 120 and the third wiring board 130 can be physically and electrically connected by the solder 140a in different directions.

In the connector 140, the length in the width direction of the second wiring board 120 is different from the length in the width direction of the third wiring board 130, and the second wiring board 120 overlaps the third wiring board 130 in the thickness direction. As a result, the second wiring board 120 and the third wiring board 130 can be connected easily.

Note that while the second wiring board 120 and the third wiring board 130 are connected by the solder 140a1 extending in the X direction and the solder 140a2 extending in the Z direction in the circuit board 100 illustrated in FIGS. 8A to 8C, the present example embodiment is not limited thereto. In the circuit board 100, the second wiring board 120 and the third wiring board 130 may be connected by the solder 140a2 extending in the Z direction.

For example, in the connector 140, the second wiring board 120 and the third wiring board 130 may be connected in the third direction (Z direction) intersecting each of the first direction (X direction) and the second direction (Y direction). As a result, the electrical connection area between the second wiring board 120 and the third wiring board 130 can be increased.

Figure 9:
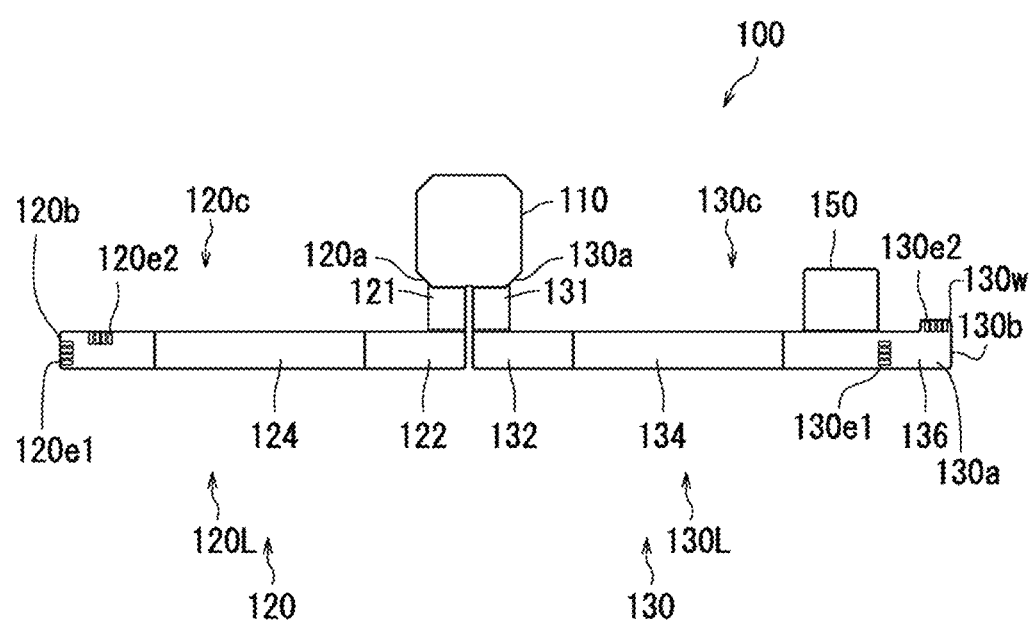
FIG. 9 is a schematic developed view of a circuit board according to an example embodiment of the present disclosure.

Next, the circuit board 100 of the present example embodiment will be described with reference to FIG. 9. FIG. 9 is a schematic developed view of the circuit board 100 of the present example embodiment.

As illustrated in FIG. 9, the circuit board 100 includes the linear plate 120L and the linear plate 130L. The linear plate 120L forms the second wiring board 120. The linear plate 130L forms the third wiring board 130.

In the second wiring board 120, the first exposed portion 120e1 and the second exposed portion 120e2 are located in the part 126. The first exposed portion 120e1 is located at the other end 120b of the second wiring board 120. The second exposed portion 120e2 is located on a side surface of the part 126 on the first wiring board 110 side (or part 121 side) when the linear plate 120L is developed.

In the third wiring board 130, the first exposed portion 130e1 and the second exposed portion 130e2 are located in the part 136. The first exposed portion 130e1 is positioned between a boundary (bent part) between the part 134 and the part 136 and the other end 130b of the third wiring board 130. The second exposed portion 130e2 is located in the wide part 130w extending from a side surface of the part 136 on the first wiring board 110 side (or part 131 side) when the linear plate 130L is developed.

The external terminal connector 150 extends from the part 136 of the third wiring board 130. The external terminal connector 150 is located on a side surface of the part 136 on the first wiring board 110 side (or part 131 side) when the linear plate 130L is developed. The external terminal connector 150 extends from the longer one of the linear plate 120L of the second wiring board 120 and the linear plate 130L of the third wiring board 130. Here, the external terminal connector 150 extends from the linear plate 130L which is the longer one of the linear plate 120L and the linear plate 130L. Therefore, since the connection with the external terminal can be facilitated, the degree of freedom in design is improved.

Note that while the second wiring board 120 and the third wiring board 130 are connected via the solder 140a in the circuit board 100 illustrated in FIGS. 3 to 9, the present example embodiment is not limited thereto. The second wiring board 120 and the third wiring board 130 may be connected by a method other than the solder 140a. For example, second wiring board 120 and third wiring board 130 may be connected by a socket.

Figure 10A:
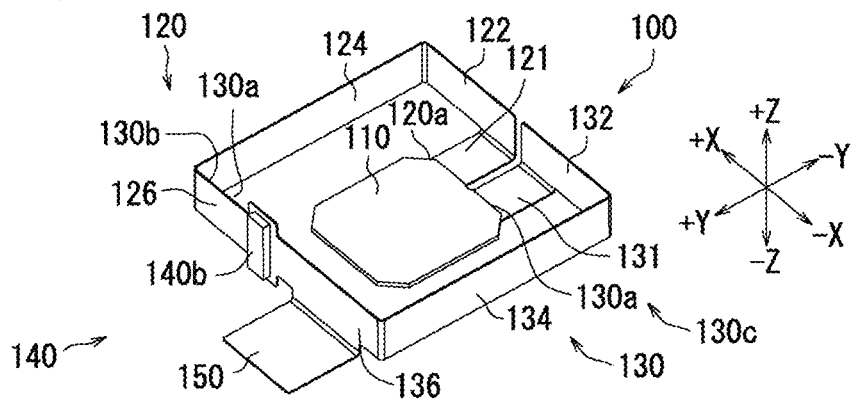
FIG. 10A is a schematic perspective view of a circuit board according to an example embodiment of the present disclosure.
Figure 10B:
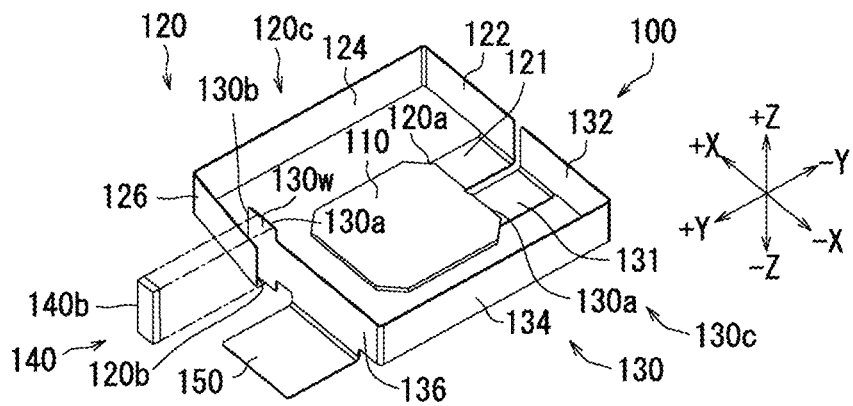
FIG. 10B is a schematic perspective view of a circuit board according to an example embodiment of the present disclosure.
Figure 10C:
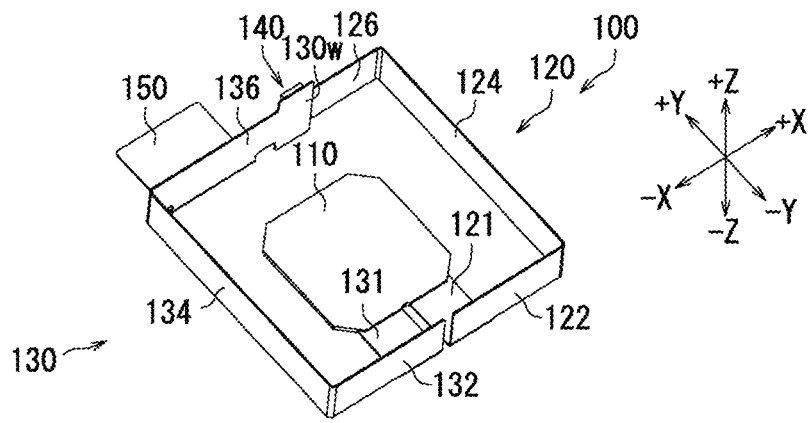
FIG. 10C is a schematic perspective view of a circuit board according to an example embodiment of the present disclosure.

Next, the circuit board 100 of the present example embodiment will be described with reference to FIGS. 1 to 10C. FIGS. 10A to 10C are schematic perspective views of the circuit board 100 according to the present example embodiment. Note that FIG. 10B illustrates a state of the circuit board 100 of the present example embodiment before the second wiring board 120 and the third wiring board 130 are connected. The circuit board 100 in FIGS. 10A to 10C has the same configuration as the circuit board 100 described above with reference to FIGS. 8A to 8C and other drawings except that a socket 140b connects the second wiring board 120 and the third wiring board 130, and overlapping description is omitted to avoid redundancy.

As illustrated in FIGS. 10A to 10C, the circuit board 100 includes the first wiring board 110, the second wiring board 120, the third wiring board 130, the connector 140, and the external terminal connector 150.

Here, the connector 140 further includes the socket 140b. The socket 140b can physically and electrically connect and hold the second wiring board 120 and the third wiring board 130.

Here, the third wiring board 130 has a wide part 130w. The wide part 130w is located in the part 136. The width (length in Z direction) of the wide part 130w is larger than the width of other parts. For example, the width (length in Z direction) of the wide part 130w is larger than the width (length in Z direction) of the parts 132 and 134.

In the third wiring board 130, the wide part 130w is located in a region where the second wiring board 120 and the third wiring board 130 overlap. The width (length in Z direction) of the wide part 130w is larger than the width of a part (part of part 126 in this example) of the second wiring board 120 overlapping the wide part 130w. When the part 126 of the second wiring board 120 overlaps the part 136 of the third wiring board 130, the +Z direction-side part and the −Z direction-side part of the wide part 130w do not overlap the part 126.

The socket 140b is attached to the wide part 130w of the third wiring board 130. Parts of the third wiring board 130 are exposed, and the wiring of third wiring board 130 is electrically connected to a wiring fixing part of the socket 140b.

The other end 120b of the second wiring board 120 is inserted into the socket 140b and fixed to the wiring fixing part of the socket 140b in a state where at least a part of the other end 120b is exposed. As a result, the socket 140b houses the other end 120b of the second wiring board 120, and the second wiring board 120 is fixed to the socket 140b.

While the socket 140b houses the other end 120b of the second wiring board 120 in this example, the socket 140b may house the other end 130b of the third wiring board 130. Alternatively, the socket 140b may house both the other end 120b of the second wiring board 120 and the other end 130b of the third wiring board 130.

As described above, the socket 140b houses a part of at least one of other end 120b of the second wiring board 120 and the other end 130b of the third wiring board 130. The second wiring board 120 and the third wiring board 130 can be fixed easily by the socket 140b.

Figure 11:
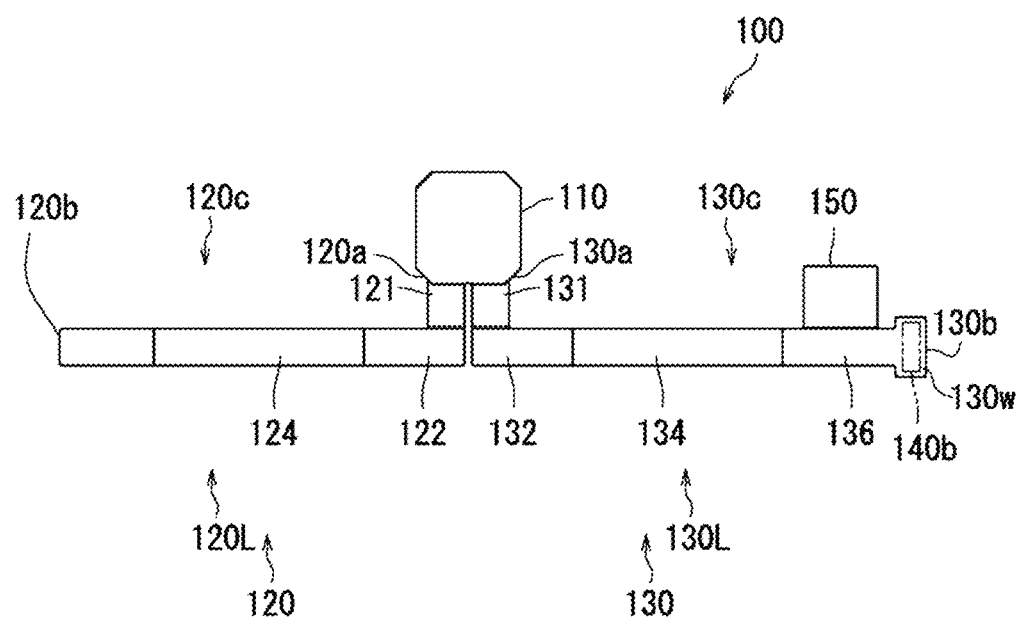
FIG. 11 is a schematic developed view of a circuit board according to an example embodiment of the present disclosure.

Next, the circuit board 100 of the present example embodiment will be described with reference to FIG. 11. FIG. 11 is a schematic developed view of the circuit board 100 of the present example embodiment.

As illustrated in FIG. 11, the circuit board 100 includes the linear plate 120L and the linear plate 130L. The linear plate 120L forms the second wiring board 120. The linear plate 130L forms the third wiring board 130.

In third wiring board 130, the wide part 130w is located at other end 130b, and the socket 140b is attached to the wide part 130w. The socket 140b is attached to the part 136.

The smartphone 300 includes the optical assembly 200 of the present example embodiment. The elastic resistance of the circuit board 100 in the smartphone 300 can be reduced.

The smartphone 300 includes the optical assembly 200 described above. As a result, shake of the optical element 10 in the smartphone 300 can be corrected.

Note that while FIG. 1 illustrates the smartphone 300 as an example of the application of the optical assembly 200 of the present example embodiment, the application of the optical assembly 200 is not limited to this. The optical assembly 200 is preferably used for a digital camera or a video camera. For example, the optical assembly 200 may be used as a part of a drive recorder. Alternatively, the optical assembly 200 may be mounted on a camera for a flight vehicle (e.g., drone).

The example embodiment of the present disclosure has been described above with reference to the drawings. Note, however, that the present disclosure is not limited to the above example embodiment, and can be implemented in various modes without departing from the gist of the invention. Further, various inventions are possible by appropriately combining the plurality of components disclosed in the above example embodiment. For example, some components may be removed from among all the components described in the example embodiment. Furthermore, components across different example embodiments may be combined as appropriate. To facilitate better understanding, the drawings schematically illustrate the components as main subjects. Hence, the thickness, length, number, interval, and the like of each illustrated component may be different from reality for the convenience of creating the drawings. Additionally, the material, shape, dimension, and the like of each component illustrated in the above example embodiments are mere examples and are not particularly limited, and various modifications can be made without substantially departing from the effects of the present disclosure.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A circuit board comprising:
a first wiring board;
a second wiring board connected to the first wiring board;
a third wiring board connected to the first wiring board;
a connector; and
an external terminal connector; wherein the second wiring board includes a first end, a second end, and a reference portion;

the first end of the second wiring board is connected to the first wiring board;

the reference portion of the second wiring board is located at any position between the first end of the second wiring board and the second end of the second wiring board;

the third wiring board includes a first end, a second end, and a different-direction reference portion;

the first end of the third wiring board is connected to the first wiring board;

the different-direction reference portion of the third wiring board extends in a direction different from an extending direction of the reference portion in any position between the first end of the third wiring board and the second end of the third wiring board;

the connector electrically connects any portion between the reference portion and the second end of the second wiring board and any portion between the different-direction reference portion and the second end of the third wiring board; and the external terminal connector extends from one of the second wiring board and the third wiring board in a direction different from a direction in which the second wiring board and the third wiring board are connected by the connector, and is connected to an external terminal.

2. He circuit board according to claim 1, wherein the first end of the second wiring board and the first end of the third wiring board are located on a first side of the first wiring board; and the second end of the second wiring board and the second end of the third wiring board are located on a second side of the first wiring board.

3. The circuit board according to claim 1, wherein the external terminal connector extends from a position different from the connector in one of the second wiring board and the third wiring board.

4. The circuit board according to claim 1, wherein in the connector, a length in a width direction of the second wiring board is different from a length in the width direction of the third wiring board, the second wiring board overlapping the third wiring board in a thickness direction.

5. The circuit board according to claim 1, further comprising a coupling portion that couples the second wiring board and the third wiring board in the first wiring board.

6. The circuit board according to claim 5, wherein one of the second wiring board and the third wiring board and the external terminal connector are defined by a single monolithic structure.

7. The circuit board according to claim 1, wherein the second wiring board includes an exposed portion located between the reference portion and the other end;

the third wiring board includes an exposed portion located between the different-direction reference portion and the other end; and the connector includes a solder covering the exposed portion of the second wiring board and the exposed portion of the third wiring board.

8. The circuit board according to claim 7, wherein the exposed portion of the second wiring board includes a first exposed portion, and a second exposed portion extending in a direction different from an extending direction of the first exposed portion;

the exposed portion of the third wiring board includes a first exposed portion, and a second exposed portion extending in a direction different from an extending direction of the first exposed portion; and the solder covers the first exposed portion of the second wiring board and the first exposed portion of the third wiring board, and covers the second exposed portion of the second wiring board and the second exposed portion of the third wiring board.

9. The circuit board according to claim 1, wherein the connector further includes a socket.

10. The circuit board according to claim 9, wherein the socket houses a portion of at least one of the second end of the second wiring board and the second end of the third wiring board.

11. The circuit board according to claim 1, wherein the second wiring board includes linear plate portions in which a linear plate extending in a longitudinal direction is bent at a plurality of positions;

the third wiring board includes linear plate portions in which a linear plate extending in the longitudinal direction is bent at a plurality of positions;

a linear plate portion located at the one end of the second wiring board among the plurality of linear plate portions of the second wiring board is connected to the first wiring board;

a linear plate portion located at the one end of the third wiring board among the linear plate portions of the third wiring board is connected to the first wiring board; and a linear plate portion located at the other end of the second wiring board among the linear plate portions of the second wiring board is connected to a linear plate portion located at the other end of the third wiring board among the plurality of linear plate portions of the third wiring board.

12. The circuit board according to claim 11, wherein a length of the linear plate of the second wiring board is different from a length of the linear plate of the third wiring board.

13. The circuit board according to claim 11, wherein the external terminal connector extends from a longer one of the linear plate of the second wiring board and the linear plate of the third wiring board.

14. The circuit board according to claim 11, wherein the external terminal connector extends from a linear plate portion located at the other end of the second wiring board among the linear plate portions of the second wiring board, or a linear plate portion located at the other end of the third wiring board among the linear plate portions of the third wiring board.

15. The circuit board according to claim 1, wherein the reference portion of the second wiring board extends to a first side in a first direction with respect to the first wiring board; and the different-direction reference portion of the third wiring board extends to a second side in the first direction with respect to the first wiring board.

16. The circuit board according to claim 15, wherein in the connector, the second wiring board and the third wiring board are connected in the first direction.

17. The circuit board according to claim 15, wherein the second wiring board further includes a portion extending from the reference portion to one side of a second direction intersecting the first direction; and the third wiring board further includes a portion extending from the different-direction reference portion to one side in the second direction.

18. The circuit board according to claim 17, wherein the second direction is orthogonal to the first direction.

19. The circuit board according to claim 17, wherein in the connector, the second wiring board and the third wiring board are connected in a third direction intersecting each of the first direction and the second direction.

20. An optical assembly comprising:
a movable body including an optical element;
a fixed body that swingably supports the movable body;
a swing mechanism that swings the movable body with respect to the fixed body; and
a circuit board connected to the movable body; wherein
the circuit board includes:
  a first wiring board;
  a second wiring board connected to the first wiring board;
  a third wiring board connected to the first wiring board;
  a connector; and
  an external terminal connector;
the second wiring board includes a first end, a second end, and a reference portion;
the first end of the second wiring board is connected to the first wiring board;
the reference portion of the second wiring board is located at any position between the first end of the second wiring board and the second end of the second wiring board;
the third wiring board includes a first end, a second end, and a different-direction reference portion;
the first end of the third wiring board is connected to the first wiring board;
the different-direction reference portion of the third wiring board extends in a direction different from an extending direction of the reference portion in any position between the first end of the third wiring board and the second end of the third wiring board;
the connector electrically connects any portion between the reference portion and the second end of the second wiring board and any portion between the different-direction reference portion and the second end of the third wiring board; and
the external terminal connector extends from one of the second wiring board and the third wiring board in a direction different from a direction in which the second wiring board and the third wiring board are connected by the connector, and is connected to an external terminal.

* * * * *